United States Patent
Alhussien et al.

(10) Patent No.: US 9,319,073 B2
(45) Date of Patent: Apr. 19, 2016

(54) MITIGATION OF WRITE ERRORS IN MULTI-LEVEL CELL FLASH MEMORY THROUGH ADAPTIVE ERROR CORRECTION CODE DECODING

(71) Applicant: Seagate Technology LLC, Cupertino, CA (US)

(72) Inventors: AbdelHakim S. Alhussien, San Jose, CA (US); Ivana Djurdjevic, San Jose, CA (US); Yu Cai, San Jose, CA (US); Erich F. Haratsch, San Jose, CA (US); Yue Li, College Station, TX (US); Earl T. Cohen, Cupertino, CA (US)

(73) Assignee: Seagate Technology LLC, Cupertino, CA (US)

( * ) Notice: Subject to any disclaimer, the term of this patent is extended or adjusted under 35 U.S.C. 154(b) by 106 days.

(21) Appl. No.: 14/194,180

(22) Filed: Feb. 28, 2014

(65) Prior Publication Data

US 2015/0229337 A1 Aug. 13, 2015

Related U.S. Application Data

(60) Provisional application No. 61/938,292, filed on Feb. 11, 2014.

(51) Int. Cl.
| | |
|---|---|
| *H04L 1/00* | (2006.01) |
| *H03M 13/35* | (2006.01) |
| *G06F 11/10* | (2006.01) |
| *H03M 13/09* | (2006.01) |
| *H03M 13/11* | (2006.01) |

(Continued)

(52) U.S. Cl.
CPC ........... *H03M 13/35* (2013.01); *G06F 11/1072* (2013.01); *H03M 13/09* (2013.01); *H03M 13/1102* (2013.01); *H03M 13/13* (2013.01); *H03M 13/2906* (2013.01)

(58) Field of Classification Search
CPC ...................................................... H04L 1/0009
USPC .......................... 714/758, 721, 723, 752, 776
See application file for complete search history.

(56) References Cited

U.S. PATENT DOCUMENTS

| | | | |
|---|---|---|---|
| 6,807,648 B1 * | 10/2004 | Cansever et al. ............... | 714/776 |
| 7,904,780 B2 | 3/2011 | Brandman ..................... | 714/752 |
| 7,925,261 B2 * | 4/2011 | Vasudevan et al. ........... | 455/434 |

(Continued)

OTHER PUBLICATIONS

E. Arikan, "Channel Polarization: A Method for Constructing Capacity-Acheiving Codes for Symmetric Binary-Input Memoryless Channels," IEEE Trans. Inform. Theory, vol. 55, pp. 3051-3073, 2009.

(Continued)

*Primary Examiner* — Fritz Alphonse
(74) *Attorney, Agent, or Firm* — Christopher P. Maiorana, PC

(57) ABSTRACT

An apparatus includes a controller and an adaptive error correction code decoder. The controller may be configured to read data from and write data to a memory device. The controller may be further configured to write data in a two-step process, which includes (i) after writing data to a least significant bit (LSB) page, checking the data stored in the LSB page using a first strength error correction code (ECC) decoding process and (ii) after writing data to a most significant bit (MSB) page associated with the LSB page, checking the data stored in both the LSB and MSB pages using a second strength error correction code (ECC) decoding process.

20 Claims, 7 Drawing Sheets

(51) Int. Cl.
*H03M 13/13* (2006.01)
*H03M 13/29* (2006.01)

(56) References Cited

U.S. PATENT DOCUMENTS

| | | | |
|---|---|---|---|
| 7,975,192 B2 | 7/2011 | Sommer et al. | 714/719 |
| 8,001,441 B2 | 8/2011 | Brandman | 714/763 |
| 8,145,984 B2 | 3/2012 | Sommer et al. | 714/797 |
| 8,174,857 B1 | 5/2012 | Sommer et al. | 365/45 |
| 8,259,497 B2 | 9/2012 | Shalvi et al. | 365/185.09 |
| 8,369,141 B2 | 2/2013 | Sommer et al. | 365/185.03 |
| 8,380,915 B2 | 2/2013 | Wood et al. | 711/100 |
| 8,397,131 B1 | 3/2013 | Sommer et al. | 714/763 |
| 8,547,740 B2 | 10/2013 | Sommer et al. | 365/185.03 |
| 8,595,573 B2 | 11/2013 | Shalvi et al. | 714/718 |
| 8,745,328 B2 * | 6/2014 | Cornwell et al. | 711/115 |
| 2009/0043951 A1 | 2/2009 | Shalvi et al. | 711/103 |
| 2010/0091535 A1 | 4/2010 | Sommer et al. | 365/45 |
| 2012/0203951 A1 | 8/2012 | Wood et al. | 711/102 |
| 2012/0216085 A1 | 8/2012 | Weingarten et al. | 714/718 |
| 2012/0297270 A1 | 11/2012 | Shalvi et al. | 714/763 |
| 2013/0121080 A1 | 5/2013 | Sommer et al. | 365/185.18 |
| 2013/0132652 A1 | 5/2013 | Wood et al. | 711/103 |

OTHER PUBLICATIONS

I. Tal et al., "List Decoding of Polar Codes," Proc. International Symposium on Information Theory (ISIT), pp. 1-5, 2011.

* cited by examiner

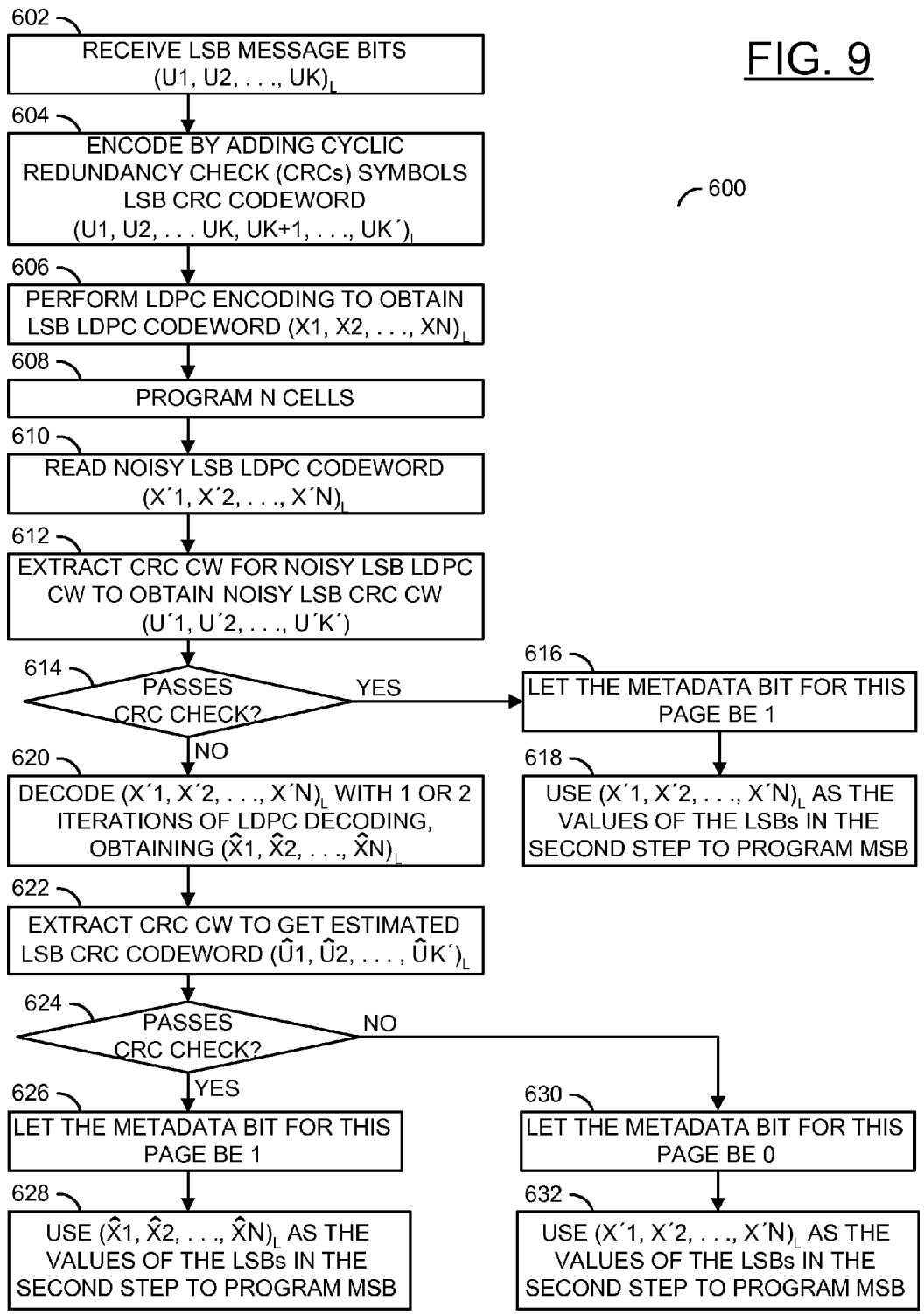

MITIGATION OF WRITE ERRORS IN MULTI-LEVEL CELL FLASH MEMORY THROUGH ADAPTIVE ERROR CORRECTION CODE DECODING

This application relates to U.S. Provisional Application No. 61/938,292, filed Feb. 11, 2014, which is hereby incorporated by reference in its entirety.

FIELD OF THE INVENTION

The invention relates to solid state storage controllers generally and, more particularly, to a method and/or apparatus for mitigating write errors in multi-level cell (MLC) flash memory through adaptive error correction code (ECC) decoding.

BACKGROUND

In multi-level cell (MLC) flash memories, least significant bit (LSB) and most significant bit (MSB) pages are encoded and written independently in order to maintain high write/read throughputs. This is done despite an evident correlation in the error mechanisms of LSB and MSB pages on the same physical wordline. Joint encoding/decoding of the LSB/MSB pages allows operating at an endurance beyond the rated endurance of the flash data block, but is not utilized because write/read throughput is more important. To reduce cell-to-cell interference and write latency a two-step programming process is employed for writing of the LSB and MSB pages on the same wordline. This process works to reduce the programming voltage swings between the original and target gray-coded cell states, and since large voltage swings results in more neighborhood cell voltage disturbance, less interference to those neighboring cells is caused by programming the current page. In addition, larger voltage swings mean more write delay as the latency of a incremental step pulse programming (ISPP) process is linearly proportional to the desired voltage swing. Hence, a double tiered programming process is employed, where the LSB is programmed by wider voltage increments, which results in a rough middle state distribution. At some point afterwards, when the MSB page is to be written, the LSB page is read from flash without passing through ECC, and finally both pages are written with a finer step pulse, which results in precise final state distribution. This approach can optimize write throughput on average, but a disadvantage is the possibility of misplacing the final state due to errors in reading the LSB page.

It would be desirable to have a method and/or apparatus for mitigating write errors in multi-level cell (MLC) flash memory through adaptive error correction code (ECC) decoding.

SUMMARY

The invention concerns an apparatus including a controller and an adaptive error correction code decoder. The controller may be configured to read data from and write data to a memory device. The controller may be further configured to write data in a two-step process, which includes (i) after writing data to a least significant bit (LSB) page, checking the data stored in the LSB page using a first strength error correction code (ECC) decoding process and (ii) after writing data to a most significant bit (MSB) page associated with the LSB page, checking the data stored in both the LSB and MSB pages using a second strength error correction code (ECC) decoding process.

BRIEF DESCRIPTION OF THE FIGURES

Embodiments of the invention will be apparent from the following detailed description and the appended claims and drawings in which:

FIG. 9 is a flow diagram illustrating an extended two-step programming process with lazy rough LDPC decoding in accordance with an example embodiment of the invention.

DETAILED DESCRIPTION OF THE EMBODIMENTS

Figure 1:
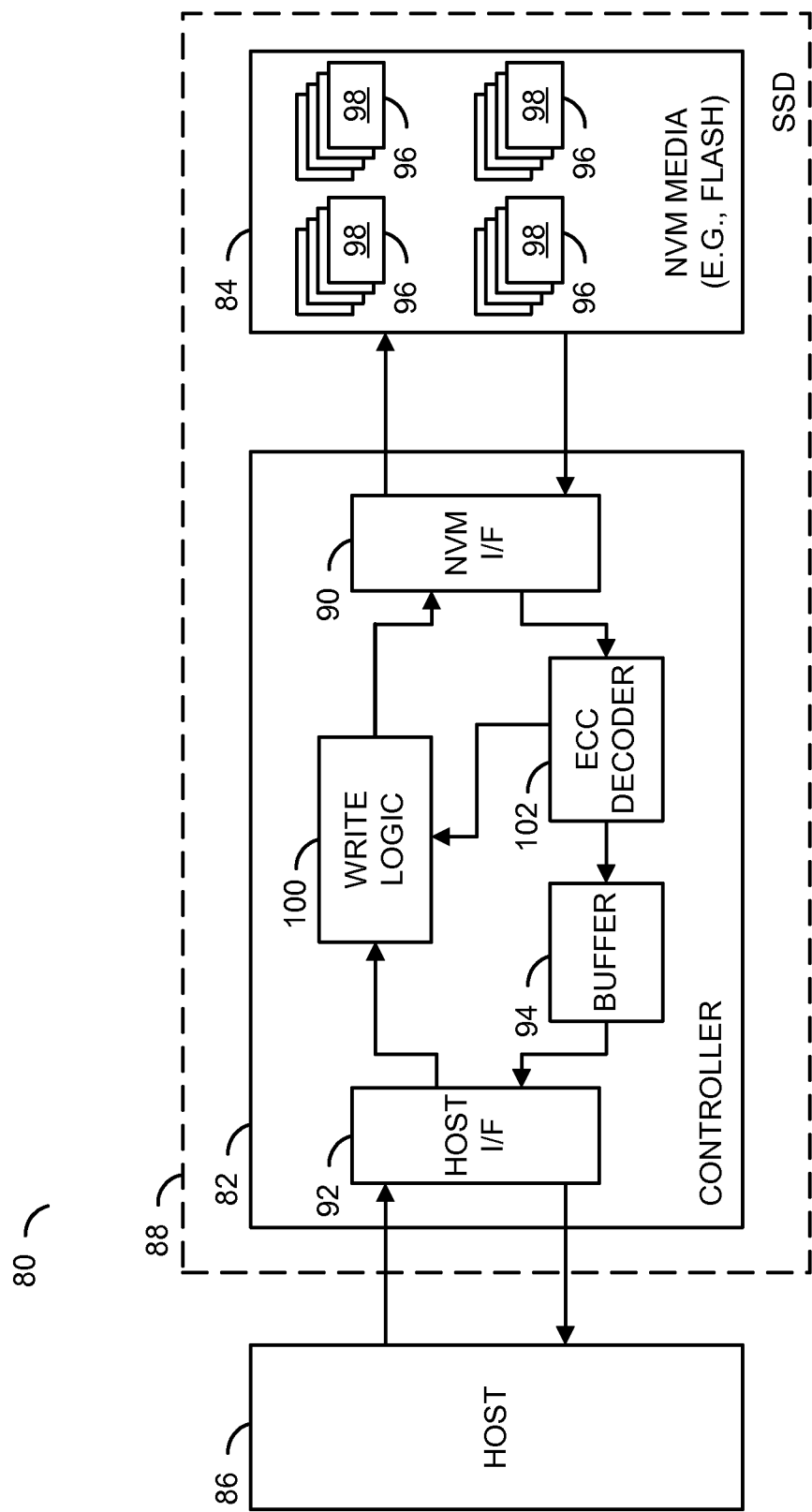
FIG. 1 is a diagram of a system in accordance with an example embodiment of the invention.

Embodiments of the invention include providing a method and/or apparatus for mitigating write errors in multi level cell (MLC) flash memory through adaptive error correction code (ECC) decoding that may (i) use one decoder engine for both decoding LSB pages during write and decoding fully programmed wordlines, (ii) provide a speedy rough decoder that has a high probability of success since the LSB page read during write may have few errors, (iii) clear LSB errors before writing a whole wordline to provide less write errors, thus increase the probability of success in reading fully programmed wordlines, (iv) provide side information to a decoder to implement more aggressive decoding than normal for fully programmed wordlines in anticipation of write errors when LSB errors are not cleared, and/or (v) be implemented as one or more integrated circuits.

In various embodiments, an adaptive strength error correction code (ECC) decoder strategy, which balances latency with fidelity, is implemented as part of two-step programming process. In the ECC decoder strategy, when reading a least significant bit (LSB) page within the two step writing process, a first strength (fast version) of the ECC decoder is implemented, while when both LSB and most significant bit (MSB) pages are read after programming is done a second strength (more aggressive version) of the ECC decoder is implemented. The more aggressive version of the ECC decoder is aided by side information about the success of LSB decoding in the writing process.

Embodiments of the invention may be used in high write throughput flash memories, where a trade off is made between high speed writes and a possibility of write errors. Embodiments may also be applied when soft decoding of the error correction code (ECC) is utilized to achieve high endurance and retention resilience capability, where soft decoding is very sensitive to write errors that result in wrong high reliabilities decisions. Such wrong high reliability decisions can drive the soft decoder into more codeword failures even at low endurance and retention scenarios. Thus, speedy effective decoding of LSB pages read in the write process is a desirable component to the introduction of powerful soft decoding in flash memory controllers.

In various embodiments, wordlines of multi-level cell (MLC) flash memories are written in a two-step process, where an LSB page is written first, then, when an MSB page is to be written, the LSB is read from the flash first to decide the final state of the program state. An adaptive strength decoder strategy balancing latency with fidelity is applied in the two-step programming process. In this strategy, when reading the LSB page within the two step writing process, a fast version of the ECC decoder is implemented, while when both pages are read after programming is done a more aggressive version of the ECC decoder is implemented, which is aided by side information about the success of LSB decoding in the writing process. The adaptive strength decoding strategy can also be applied to flash memories where more than two bits are stored in a cell (e.g., in three bit per cell or higher density memories), as long as multiple step programming is employed in which previous bits are read from the flash memory before the remaining bits are written.

Referring to FIG. 1, a diagram is shown illustrating a non-volatile memory system 80 in accordance with an embodiment of the invention. In various embodiments, the non-volatile memory system 80 comprises a block 82, a block 84, and a block 86. The block 82 comprises a memory controller implementing a two-step writing process using an adaptive error correction code (ECC) decoding technique in accordance with an embodiment of the invention. The block 84 comprises a non-volatile memory (NVM) media. The block 86 comprises a host.

The controller 82 may be configured to control one or more individual non-volatile memory lanes. In some embodiments, the controller 82 may implement multiple memory lane controller instances to control a plurality of non-volatile memory lanes. The controller 82 has a non-volatile memory interface 90 configured to couple the controller 82 to the non-volatile memory media 84. The non-volatile memory media 84 may comprise one or more non-volatile memory devices 96. The non-volatile memory devices 96 have, in some embodiments, one or more non-volatile memory die 98. According to a type of a particular one of the non-volatile memory devices 96, a plurality of non-volatile memory die 98 in the particular non-volatile memory device 96 are optionally and/or selectively accessible in parallel. The non-volatile memory devices 96 are generally representative of one type of storage device enabled to communicatively couple to controller 82. However, in various embodiments, any type of storage device is usable, such as SLC (single level cell) NAND flash memory, MLC (multi-level cell) NAND flash memory, TLC (triple level cell) NAND flash memory, 1z flash memory, 3D flash memory, NOR flash memory, read-only memory (ROM), static random access memory (SRAM), dynamic random access memory (DRAM), magneto-resistive random-access memory (MRAM), ferromagnetic memory (e.g., FeRAM, F-RAM FRAM, etc.), phase-change memory (e.g., PRAM, PCRAM, etc.), racetrack memory (or domain-wall memory (DWM)), resistive random-access memory (RRAM or ReRAM), or any other type of memory device or storage medium.

In some embodiments, the controller 82 and the non-volatile memory media 84 are implemented on separate integrated circuits. When the controller 82 and the non-volatile memory media 84 are implemented as separate integrated circuits (or devices), the non-volatile memory interface of the controller 82 is generally enabled to manage a plurality of data input/output (I/O) pins and a plurality of control I/O pins. The data I/O pins and the control I/O pins may be configured to connect the device containing the controller 82 to the external device (s) forming the non-volatile memory media 84. In various embodiments, the controller 82 is implemented as an embedded controller. In various embodiments, the controller 82 and the NVM media 84 implement a solid-state drive or disk (SSD) 88.

The controller 82 also has a command interface 92 configured to receive commands and send responses to the host 86. In embodiments implementing a plurality of non-volatile memory lanes, the controller 82 also includes multiplexing circuitry coupling the multiple instances of memory lane controllers to circuitry (e.g., a back-end processing unit) providing scheduling and/or data management of the plurality of non-volatile memory devices 96. In various embodiments, the controller 82 comprises data buffering and direct memory access (DMA) engines to store data or other information and to move the data or other information between the host 86 and the NVM media 84 using one or more memory lane controllers within the controller 82.

When a non-volatile memory read operation is performed (e.g., in response to a request originating either externally from the host or internally from the controller) raw data is retrieved from the NVM media 84. To ensure the data returned is correct, various ECC codes can be used, such as BCH (Bose Chaudhuri Hocquenghem) codes, LDPC (low-density parity-check) code, turbo codes, polar codes, and convolutional codes. The ECC decoding may operate on the granularity of a codeword (of fixed or variable size), referred to as an e-page. Under normal conditions, the ECC decoding can correct errors in the raw e-page using on-the-fly (or dynamic) decoding and return the corrected e-page (and/or other requested data, such as statistics) immediately (e.g., via a buffer 94). In such cases, the read operation for the particular e-page is considered complete. The controller 82 can perform various retry tasks when on-the-fly read decoding fails.

In various embodiments, the controller 82 includes a circuit 100 that implements a two-step writing process and a circuit 102 that implements an adaptive error correction code (ECC) encoding and decoding functionality. In various embodiments, the circuit 102 may also provide higher-level redundancy functions using a redundancy code, such as a RAID (redundant array of independent drives)-like code, etc., across a number of the dies 98 in a NVM device 96.

Figure 2:
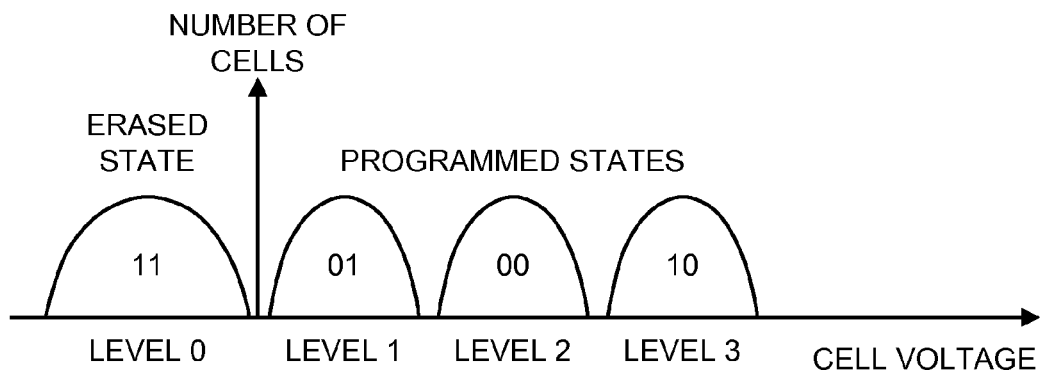
FIG. 2 is a diagram of illustrating cell level distributions for multi-level cells (MLCs) in a flash memory.

Referring to FIG. 2, a diagram is shown illustrating an example of cell voltage level distributions for multi-level cells (MLCs) in flash memories. Multi-level cells (MLCs) are widely used as the basic storage units in flash memories. A MLC has four levels (e.g., an erased state and three programmed states) and is able to store 2 bits. In various embodiments, Gray coding is used for mapping between cell voltage levels and the stored bits. In some embodiments, the Gray coding is implemented as follows: a cell level (or state) 0 corresponds to bits (1,1), a cell level 1 corresponds to bits (0,1), a cell level 2 corresponds to bits (0,0), and a cell level 3 corresponds to bits (1,0). In other embodiments, the state to bit mapping is implemented either using a non-Gray coding or storing more than 2 bits per cell. However, whenever a noisy read of a portion of the cell bits (either in a parallel or in sequential fashion) is done first, before writing another portion of the bits, an adaptive strength decoding strategy in accordance with an embodiment of the invention can be utilized to reduce the harm of potential write errors on decoding success of the read.

Figure 3:
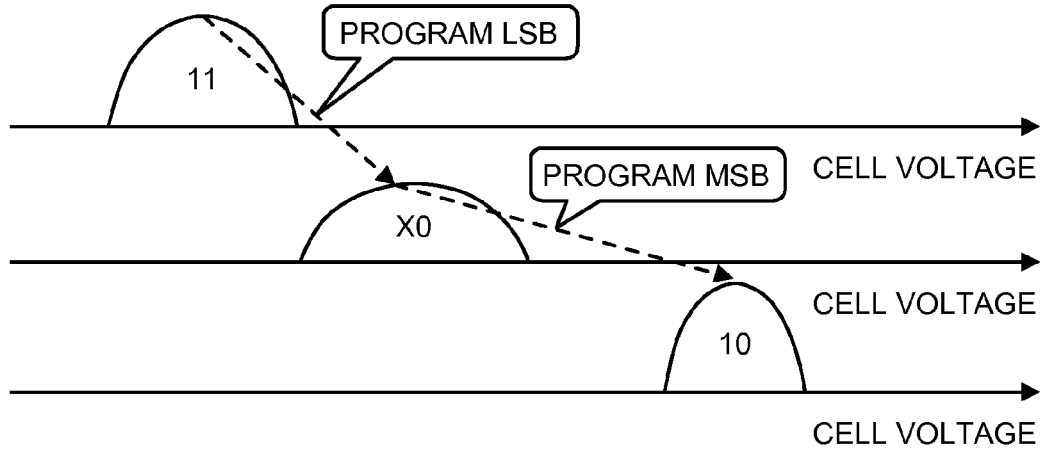
FIG. 3 is a diagram of illustrating an example of programming a MLC at erase state to store a pair of bits (1,0)

Referring to FIG. 3, a diagram illustrating an example of programming a MLC at erase state to store a pair of bits (1,0) is shown. To program a MLC to some level, a 2-step programming process is used. Given a pair of bits (e.g., $X_{MSB}$, $X_{LSB}$) to be stored in a cell, charge is applied to the cell so that voltage level of the cell falls into the range that reflects the value of the least significant bit (LSB) $X_{LSB}$. The cell is then read again, obtaining a noisy value of the LSB denoted by $X'_{LSB}$. Given the value of the MSB $X_{MSB}$, charge is continued to be applied to the cell so that the cell voltage falls into the range corresponding to the bits ($X_{MSB}$, $X'_{LSB}$).

LSB and MSB pages are written independently in flash memories to maintain high write/read throughput. To reduce cell-to-cell interference and reduce write latency, the two-step programming process is employed to reduce voltage swings. Large voltage swings result in more disturbance of neighboring cells (e.g., program disturb). Incremental write latency is linearly proportional to voltage swings. Due to the two-step programming, the LSB is read from flash before programming the full wordline, which can result in write errors. The LSB page is not buffered (kept in the controller) after writing to the flash because the MSB page might not be written immediately afterwards. The LSB read process before MSB write latency affects write throughput and, therefore, is important. In various embodiments, an adaptive strength ECC decoder is implemented to balance latency (fast decoding in write) with fidelity (slower, more complex decoding in regular read). In various embodiments, the adaptive ECC decoding technique provides rough high speed decoding of the LSB before writing the MSB and arbitrarily strong decoding fidelity for normal reading of pages in fully programmed wordlines.

Figure 4:
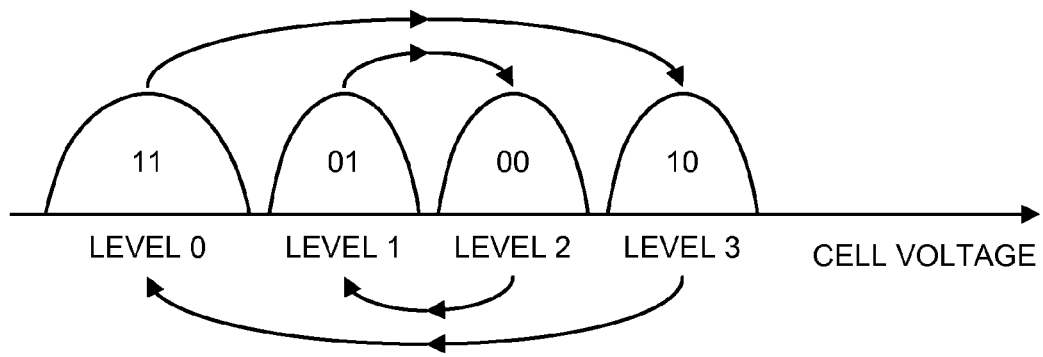
FIG. 4 is a diagram illustrating patterns of write errors.

Referring to FIG. 4, a diagram is shown illustrating patterns of write errors. A write error occurs when a multi-level cell is programmed to a state which is different than an intended state (e.g., because the LSB was misread before writing the MSB or some other reasons). When a write error occurs, the bit written does not equal the bit read (e.g., $X_{LSB} \ne X'_{LSB}$). In general, a write error makes the following two error patterns possible:

cell level 0 (1, 1) is interchanged with cell level 3 (1, 0);
cell level 1 (0, 1) is interchanged with cell level 2 (0, 0).

Because of write errors, digital signal processing (DSP) performed by the controller during soft decoding can be misguided to generate wrong log likelihood ratios (LLRs). Wrong LLRs increase the probability of decoding failures.

In various embodiments, the cell threshold voltage is programmed using an incremental step pulse programming (ISPP) process. Important considerations when implementing ISPP include the starting and ending voltages and that a cell can only be programmed to a higher voltage. Taking as an example a case where $X_{LSB}=1$ was written first (e.g., the cell is in state "11"), and the LSB is misread to be 0 (e.g., because the threshold voltage shifted upward), if $X_{MSB}=0$ is to be written, after miss-reading the state to be LSB=0, the controller would try to push the voltage using ISPP up to the state "00", causing a write error. If the misread LSB is corrected to LSB=1, then, if the cell voltage is already above the flag where the threshold voltage is considered to be in the state "01", the controller does not need to pump extra voltage and the cell is left "as is." Alternatively, if the cell is just below where the threshold voltage is considered to be in the state "01", the controller may provide a voltage nudge. If $X_{MSB}=1$ is to be written, and the LSB was corrected to LSB=1, then nothing needs to be done because "11" needs to be written, but that will not translate to a write error, the voltage will be in the region where the LLR magnitude will be small. If the LSB was not corrected, the controller would pump voltage up to the state "10", causing a write error.

In another example, $X_{LSB}=0$ is written first and the LSB is misread to be LSB=1. When $X=_{MSB}=1$ is to be written (e.g., the correct state is "10" and not "11"), if the LSB is corrected, the controller pumps the voltage up until the cell level is enough to be interpreted as being in the state "10", while if the LSB is not corrected, the controller does not pump the voltage higher and the cell stays in the state "X0", which is a write in the LSB bit. On the other hand, if $X_{MSB}=0$ is to be written, the correct state is "00" and not "01", and the result is the same, if the LSB is corrected, the controller pumps the voltage upwards since the state "X0" is below "00", while if the LSB is not corrected, the voltage is pumped up to the wrong state "01".

Figure 5:
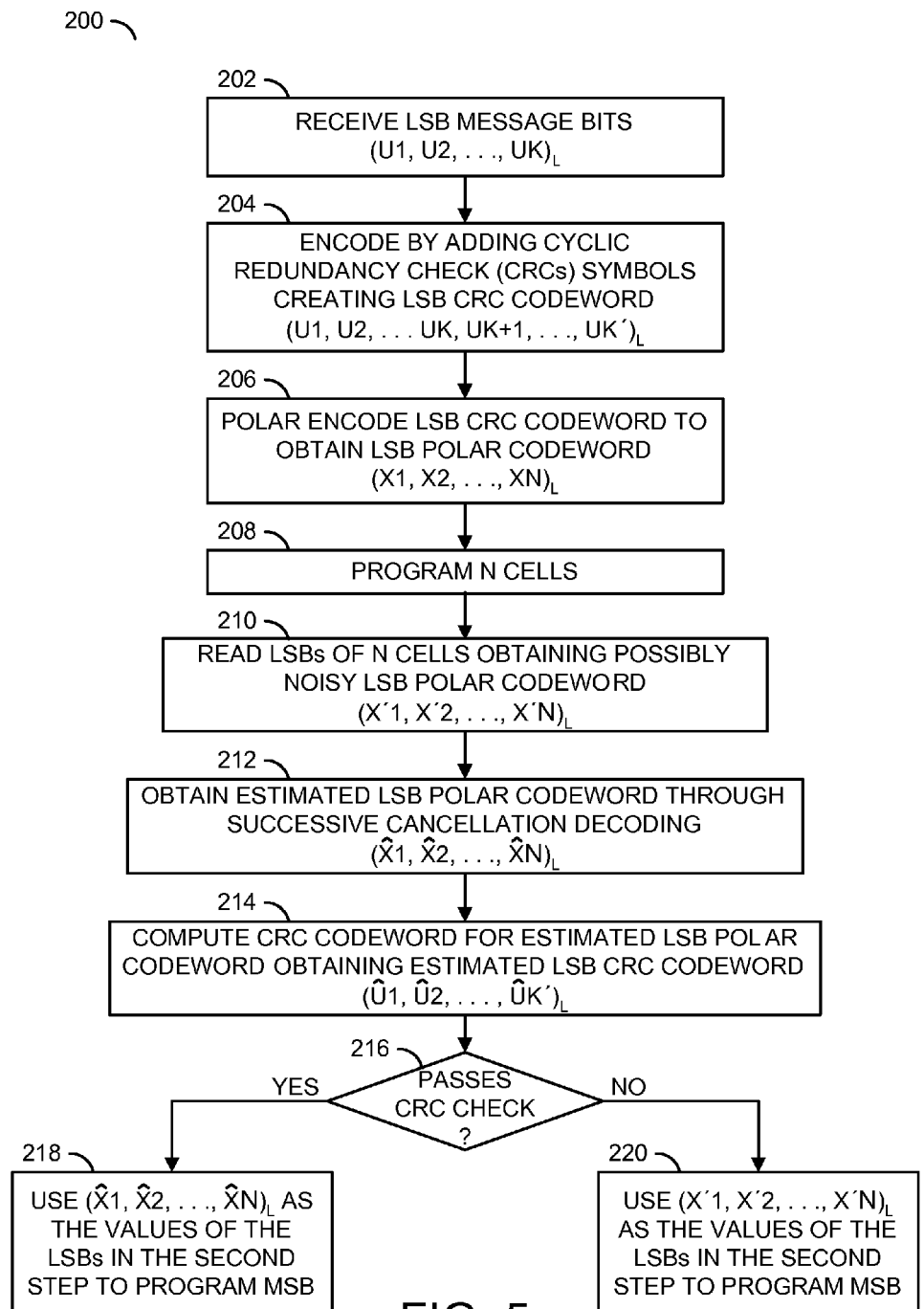
FIG. 5 is a flow diagram illustrating a two-step programming process with rough decoding in accordance with an example embodiment of the invention.

Referring to FIG. 5, a flow diagram of a process 200 is shown illustrating a two-step programming process with rough decoding in accordance with an example embodiment of the invention. A write error can be detected by first detecting the errors in the LSBs when the LSBs are read prior to programming the MSBs. In various embodiments, the process (or method) 200 implements a scheme for detecting write errors by adaptively using list decoder of polar codes. In various embodiments, the MSBs and LSBs are separately encoded with an encoder of polar codes, resulting in two polar code words. In various embodiments, the MSBs use polar codes so the same decoding circuitry can be shared. However, other embodiments may be implemented in which the MSBs use other codes. When reading the LSBs prior to programming the MSBs, successive cancellation decoding is used to correct errors in the LSBs. Successive cancellation decoding provides a fast, albeit weak decoding scheme that is sufficient when there are few errors such as the case with distinguishing states "11" and "X0". A cyclic redundancy check (CRC) is performed to ensure the decoding result is correct. The decoded LSBs are used together with the incoming MSBs to program the cells. Successive cancellation is an instance of the list decoding scheme where the list size is set to 1, and provides a minimal decoding technique for the polar encoded LSB page. Examples of list decoding of polar codes and successive cancellation decoding are described in E. Arikan, "Channel Polarization: A Method for Constructing Capacity-Achieving Codes for Symmetric Binary-Input Memoryless Channels," IEEE Trans. Inform. Theory, vol. 55, pp 3051-3073, 2009, and I. Tal et al., "List Decoding of Polar Codes," Proc. International Symposium on Information Theory (ISIT), pp. 1-5, 2011, which are incorporated by reference.

In various embodiments, the process 200 comprises a step (or state) 202, a step (or state) 204, a step (or state) 206, a step (or state) 208, a step (or state) 210, a step (or state) 212, a step (or state) 214, a step (or state) 216, a step (or state) 218, and a step (or state) 220. In the step 202, LSB message bits are received. In the step 204, the LSB message bits are encoded by adding CRC symbols to create a LSB CRC codeword. In the step 206, the LSB CRC codeword is encoded using polar codes to obtain a polar codeword. In the step 208, N memory cells are programmed using the LSB polar codeword.

When the MSBs of the N cells are to be programmed, the LSBs of the N cells are read in the step 210, obtaining a possibly noisy LSB polar codeword. In the step 212, successive cancellation decoding is performed on the noisy LSB polar codeword read from the N cells, producing an estimated LSB polar codeword. In the step 214, an estimated LSB CRC codeword is generated by calculating the CRC codeword for the estimated LSB polar codeword. In the step 216, a CRC check is performed. If the CRC check is passed, the process 200 moves to the step 218. If the CRC fails, the process 200 moves to the step 220. In the step 218, the estimated LSB polar codeword is used as the values of the LSBs when programming the MSBs. In the step 220, the possibly noisy LSB polar codeword read from the N cells is used as the values of the LSBs when programming the MSBs.

Successive cancellation decoding of polar codes, which has a list size equal to 1, executes faster than the full strength list decoding of polar codes, which has a list size greater than 1. Since the states "11" and "X0" are placed relatively far apart in the voltage window, the number of LSB read errors will be small, hence, the number of write errors is small, and successive cancellation decoding is sufficient and effective in detecting write errors. Successive cancellation decoding uses the same circuits of the full strength list decoding of polar codes by setting the list size to 1. The CRC should be chosen to meet the data reliability needs of the particular flash memories. For instance, CRC-64, which guarantees $10^{-15}$ detection failure rate, could be one of the CRC candidates.

In the process 200, when the CRC checks fail, it is likely that write errors occur. In such cases, when the data is read by a user and full strength decoding is used, the list size of the full strength decoding can be further increased. In various embodiments, further extensions of the programming scheme illustrated by the process 200 may be made when implementing an adaptive ECC decoding scheme in accordance with embodiments of the invention. Some examples of extensions are described below in connection with FIGS. 6-8.

Figure 6:
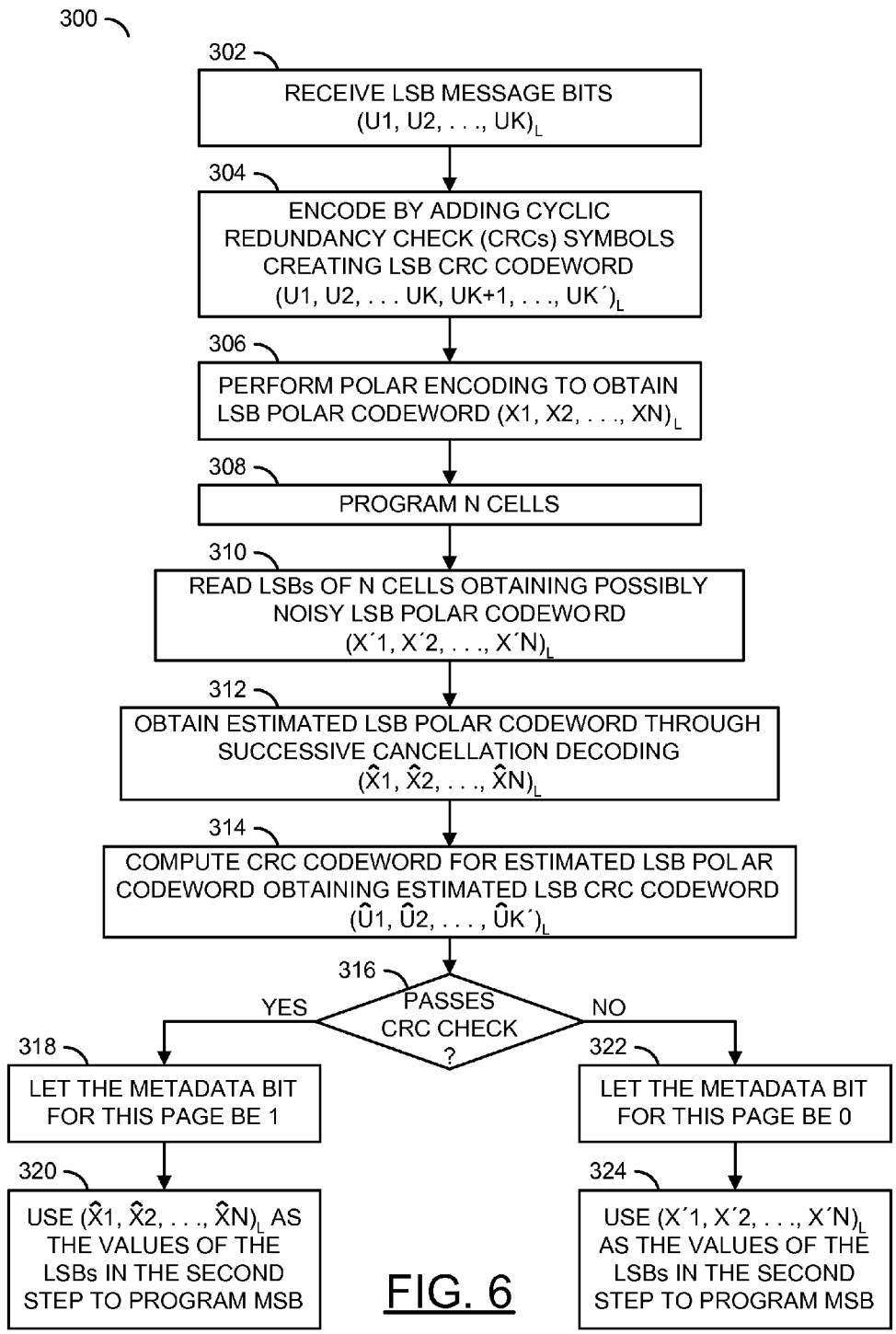
FIG. 6 is a flow diagram illustrating an extended two-step programming process with rough polar decoding in accordance with an example embodiment of the invention.

Referring to FIG. 6, a flow diagram of a process 300 is shown illustrating an extended two-step programming process with rough polar decoding in accordance with an example embodiment of the invention. In various embodiments, the process (or method) 300 may be implemented which modifies (extends) the process 200 by adding 1 bit of metadata for each page to indicate whether the CRC check passes or fails. In various embodiments, the process 300 comprises a step (or state) 302, a step (or state) 304, a step (or state) 306, a step (or state) 308, a step (or state) 310, a step (or state) 312, a step (or state) 314, a step (or state) 316, a step (or state) 318, a step (or state) 320, a step (or state) 322, and a step (or state) 324. In the step 302, LSB message bits are received. In the step 304, the LSB message bits are encoded by adding CRC symbols to create a LSB CRC codeword. In the step 306, the LSB CRC codeword is encoded using polar codes to obtain a polar codeword. In the step 308, N memory cells are programmed using the LSB polar codeword.

When the MSBs of the N cells are to be programmed, the LSBs of the N cells are read in the step 310, obtaining a possibly noisy LSB polar codeword. In the step 312, successive cancellation decoding is performed on the noisy LSB polar codeword read from the N cells, producing an estimated LSB polar codeword. In the step 314, an estimated LSB CRC codeword is generated by calculating the CRC codeword for the estimated LSB polar codeword. In the step 316, a CRC check is performed. If the CRC check is passed, the process 300 moves to the steps 318 and 320. If the CRC fails, the process 300 moves to the steps 322 and 324. In the step 318, the 1 bit metadata is set to a value of 1, and the estimated LSB polar codeword is used as the values of the LSBs when programming the MSBs in the step 320. In the step 322, the 1 bit metadata is set to a value of 0, and the possibly noisy LSB polar codeword read from the N cells is used as the values of the LSBs when programming the MSBs in the step 324.

Figure 7:
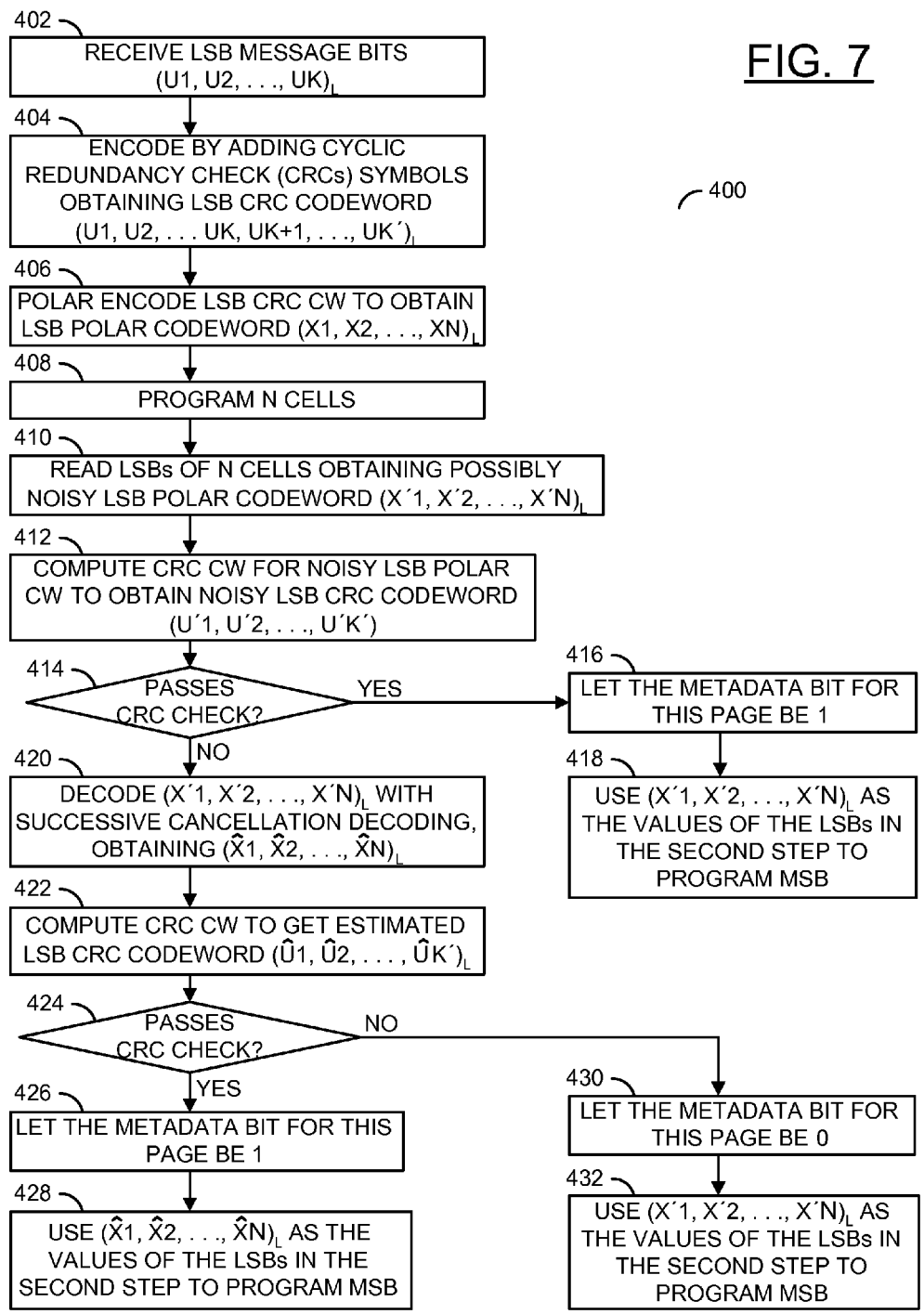
FIG. 7 is a flow diagram illustrating an extended two-step programming process with lazy rough polar decoding in accordance with an example embodiment of the invention.

Referring to FIG. 7, a flow diagram of a process 400 is shown illustrating an extended two-step programming process with lazy rough polar decoding in accordance with an example embodiment of the invention. In some embodiments, rough decoding is made lazy. Specifically, CRC decoding is performed first. If the CRC checks, rough decoding is skipped to speed up the programming.

In various embodiments, the process 400 comprises a step (or state) 402, a step (or state) 404, a step (or state) 406, a step (or state) 408, a step (or state) 410, a step (or state) 412, a step (or state) 414, a step (or state) 416, a step (or state) 418, a step (or state) 420, a step (or state) 422, a step (or state) 424, a step (or state) 426, a step (or state) 428, a step (or state) 430, and a step (or state) 432. In the step 402, LSB message bits are received. In the step 404, the LSB message bits are encoded by adding CRC symbols to create a LSB CRC codeword. In the step 406, the LSB CRC codeword is encoded using polar codes to obtain an LSB polar codeword. In the step 408, N memory cells are programmed using the LSB polar codeword.

When the MSBs of the N cells are to be programmed, the LSBs of the N cells are read in the step 410, obtaining a possibly noisy LSB polar codeword. In the step 412, a noisy LSB CRC codeword is computed for the noisy LSB polar codeword read from the N cells. In the step 414, a CRC check is performed. If the CRC check is passed, the process 400 moves to the steps 416 and 418. If the CRC fails, the process 400 moves to the step 420. In the step 416, the 1 bit metadata is set to a value of 1, and the noisy LSB polar codeword read from the N cells is used as the values of the LSBs when programming the MSBs in the step 418.

In the step 420, successive cancellation decoding is performed on the noisy LSB polar codeword read from the N cells, producing an estimated LSB polar codeword. In the step 422, an estimated LSB CRC codeword is generated by calculating the CRC codeword for the estimated LSB polar codeword. In the step 424, a CRC check is performed. If the CRC check is passed, the process 400 moves to the steps 426 and 428. If the CRC fails, the process 400 moves to the steps 430 and 432. In the step 426, the 1 bit metadata is set to a value of 1, and the estimated LSB polar codeword is used as the values of the LSBs when programming the MSBs in the step 428. In the step 430, the 1 bit metadata is set to a value of 0, and the possibly noisy LSB polar codeword read from the N cells is used as the values of the LSBs when programming the MSBs in the step 432.

Figure 8:
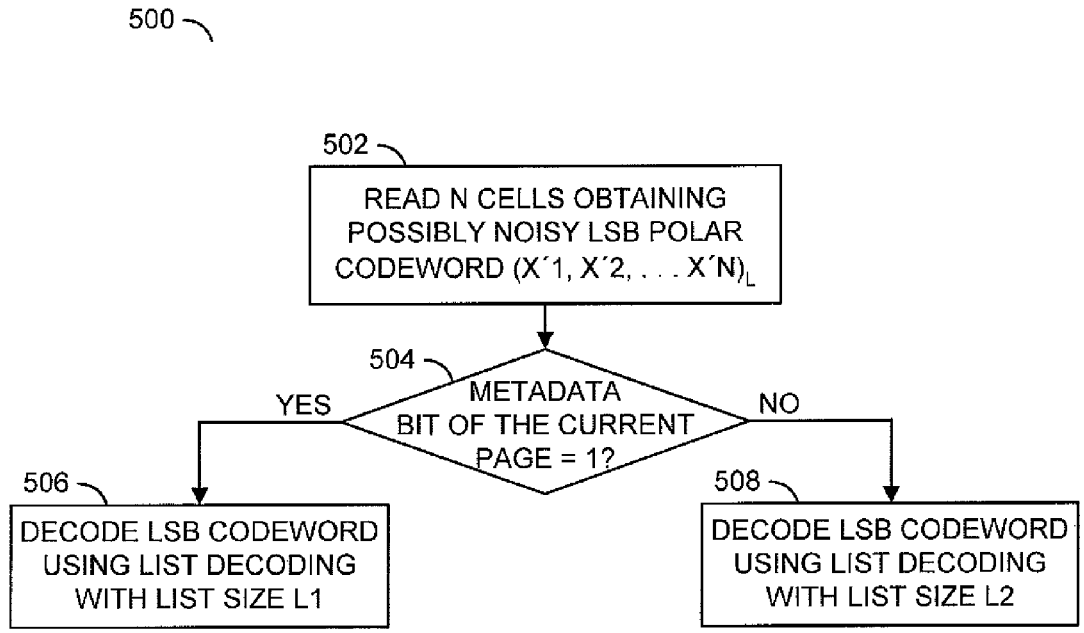
FIG. 8 is a flow diagram illustrating a process for adaptive full-strength list decoding using metadata generated during programming in accordance with an example embodiment of the invention.

Referring to FIG. 8, a flow diagram of a process 500 is shown illustrating a process for adaptive full-strength list decoding using metadata generated during programming in accordance with an example embodiment of the invention. In various embodiments, the process (or method) 500 comprises a step (or state) 502, a step (or state) 504, a step (or state) 506, and a step (or state) 508. When full-strength decoding is performed, the process 500 begins in the step 502 where N cells are read to obtain a possibly noisy LSB polar codeword. In the step 504, a further check is made to determine whether the metadata of the current page indicates the CRC check during the writing process was passed (e.g., a value of 1) or failed (e.g., a value of 0). If the metadata indicates that the CRC check failed, the list size of the decoder is increased (e.g., to a list size L2). Otherwise, the original list size (e.g., a list size L1) is used. The list size L2 is generally greater than the list size L1. In some instances, the values L1 and L2 may be set empirically. The metadata bits can be stored either in the memory of the flash memory controller or in the flash memory itself. The metadata bits do not need to be protected with ECCs. However, in embodiments where it is desirable not to run the more aggressive L2 decoding scheme unnecessarily, the metadata should be protected (e.g., from flipping to 0) when stored in the flash memory. In such a case, a simple repetition code may be used with a simple majority logic decoding and negligible storage need for parity. In embodiments where encoding is not desirable, the metadata can be stored using the states "11" and "10" for values 1 and 0, respectively. For example, if the value of the metadata is 1, the corresponding cell is programmed to "11" (e.g., left in the erased state). If the value of the metadata is 0, the corresponding cell is programmed first to "X0", then finally to "10". The value of the metadata cell (or cells if a repetition code is used and the metadata bit is repeated and multiple cells are used to store the metadata bit) is determined in the first programming step. By storing the metadata as LSB rather than MSB, the error probability should be much less than if the metadata is stored as the MSB rather than the LSB (e.g., states "11" and "01"), because the dominant error mechanism is reading the LSB state "X0" and then programming the cell to the state "10". Making an error between the states "11" and "X0" is less likely than making an error between the states "11" and "01".

Referring to FIG. 9, a flow diagram of a process 600 is shown illustrating an extended two-step programming process with lazy rough LDPC decoding in accordance with an example embodiment of the invention. The process (or method) 600 generally illustrates a second programming scheme in accordance with an embodiment of the invention. The process 600 implements a scheme for detecting write errors by adaptively using one or more decoder iterations of low density parity coding (LDPC) code (or other methods of running the LDPC decoder in a faster decoding mode). The MSBs and LSBs are separately encoded with an encoder using LDPC codes, resulting in two LDPC code words. In various embodiments, the MSBs also use LDPC codes in order to share the same decoding circuits. However, some embodiments may use other codes to meet the design criteria of a particular implementation.

When reading the LSBs prior to programming the MSBs, a small number of LDPC message passing decoder iterations (e.g., 1, 2, or other sufficiently small programmable value) are used to correct errors in the LSBs. The CRC is checked to make sure the decoding result is correct. The decoded LSBs together with the incoming MSBs are then used to program the cells. An optional extension (similar to that illustrated in FIG. 7 for rough polar decoding) may be implemented for LDPC adaptive decoding. In some embodiments, 1 bit of metadata is added for each page to indicate whether the CRC checks or not. If a CRC is not used, the LDPC syndrome can be used instead since LDPC has very low miscorrection probability. Again, the rough decoding may be made lazy, by performing CRC decoding first. If the CRC checks, the LDPC rough decoding is skipped to speed up the programming process. This step can be also skipped if CRC is not used and LDPC message passing decoding is invoked right after the LSB read.

If CRC is not used, a dedicated circuit that checks the noisy LDPC syndrome can be implemented to save power compared to the case of running one iteration, or a portion thereof, of the LDPC message passing decoder. The LDPC decoder can run in rough mode in ways other than reducing the maximum number of iterations. In some embodiments, the number of bits used to represent LLR messages in fixed point implementation can be reduced to save power or decoding latency on average. For instance, LLR messages can be represented using 2 or 3 bits when reading LSBs in the first programming step compared to 4 or more bits when decoding the fully programmed pages. In embodiments where writing latency is more important than power, the decoder can process two circulants in one cycle at the expense of higher power expenditure when decoding LSBs in programming compared to processing one circulant per cycle in decoding fully programmed pages.

Because the erase state "11" has a large noise margin to the rough intermediate state "X0", LSB pages in partially programmed wordlines have very few raw errors. Thus, if one LDPC decoding iteration or a portion thereof is run, the errors after LDPC are most likely isolated errors, where all connected checks are unsatisfied and none are shared between errors (e.g., none of the checks will be wrongfully satisfied because of a connection to an even number of errors simultaneously). Therefore, a low complexity fast flipping scheme can be run instead of message passing decoding when decoding the LSB page in the first programming step.

In various embodiments, the process 600 comprises a step (or state) 602, a step (or state) 604, a step (or state) 606, a step (or state) 608, a step (or state) 610, a step (or state) 612, a step (or state) 614, a step (or state) 616, a step (or state) 618, a step (or state) 620, a step (or state) 622, a step (or state) 624, a step (or state) 626, a step (or state) 628, a step (or state) 630, and a step (or state) 632. In the step 602, LSB message bits are received. In the step 604, the LSB message bits are encoded by adding CRC symbols to create a LSB CRC codeword. In the step 606, the LSB CRC codeword is encoded using LDPC codes to obtain an LSB LDPC codeword. In the step 608, N memory cells are programmed using the LSB LDPC codeword.

When the MSBs of the N cells are to be programmed, the LSBs of the N cells are read in the step 610, obtaining a possibly noisy LSB LDPC codeword. In the step 612, a noisy LSB CRC codeword is extracted from the noisy LSB LDPC codeword read from the N cells. In the step 614, a CRC check is performed. If the CRC check is passed, the process 600 moves to the steps 616 and 618. If the CRC fails, the process 600 moves to the step 620. In the step 618, the 1 bit metadata is set to a value of 1, and the noisy LSB LDPC codeword read from the N cells is used as the values of the LSBs when programming the MSBs in the step 618.

In the step 620, 1 or 2 (or other programmable number) iterations of LDPC decoding are performed on the noisy LSB LDPC codeword read from the N cells, producing an estimated LSB LDPC codeword. In the step 622, an estimated LSB CRC codeword is extracted. In the step 624, a CRC check is performed. If the CRC check is passed, the process 600 moves to the steps 626 and 628. If the CRC fails, the process 600 moves to the steps 630 and 632. In the step 626, the 1 bit metadata is set to a value of 1, and the estimated LSB LDPC codeword is used as the values of the LSBs when programming the MSBs in the step 628. In the step 630, the 1 bit metadata is set to a value of 0, and the possibly noisy LSB LDPC codeword read from the N cells is used as the values of the LSBs when programming the MSBs in the step 632. The CRC checks are optional and may be omitted when using LDPC because the LDPC syndrome is a sufficiently reliable flag.

In the LDPC-based extension, the LSB page is read, and the controller attempts to decode the LDPC with a few LDPC iterations (e.g., 1 or 2). If the LDPC decodes, the corrected LSB is used to write the MSB in the second programming step and avoid write errors. If the LDPC decoding fails (e.g., indicated by a non-zero syndrome) or the CRC check fails, the controller still writes the LSB and MSB, but uses one bit of metadata to save an indication that the event (e.g., EVENT 1) occurred. When the wordline needs to be read, the controller reads the LSB page, and because the metadata indicates that EVENT 1 happened, the controller uses more LDPC iterations or invokes one or more retry mechanisms designed for eliminating write errors.

In some embodiments, since LSB pages have very few errors, after the page is read, just one iteration of LDPC is performed. All of the bits for which all connected checks (as many as the column weight) are unsatisfied are flipped (e.g., the decoder may include a hardware assist inside to output this information) and the CRC is run. If the LSB page passes the CRC checks, the corrected LSB is used to write the MSB. If not, the EVENT 1 is declared. The theoretical basis for this is that at very low raw bit error rate (RBER) there most likely are separate isolated errors where all connected checks are unsatisfied.

Figure 10:
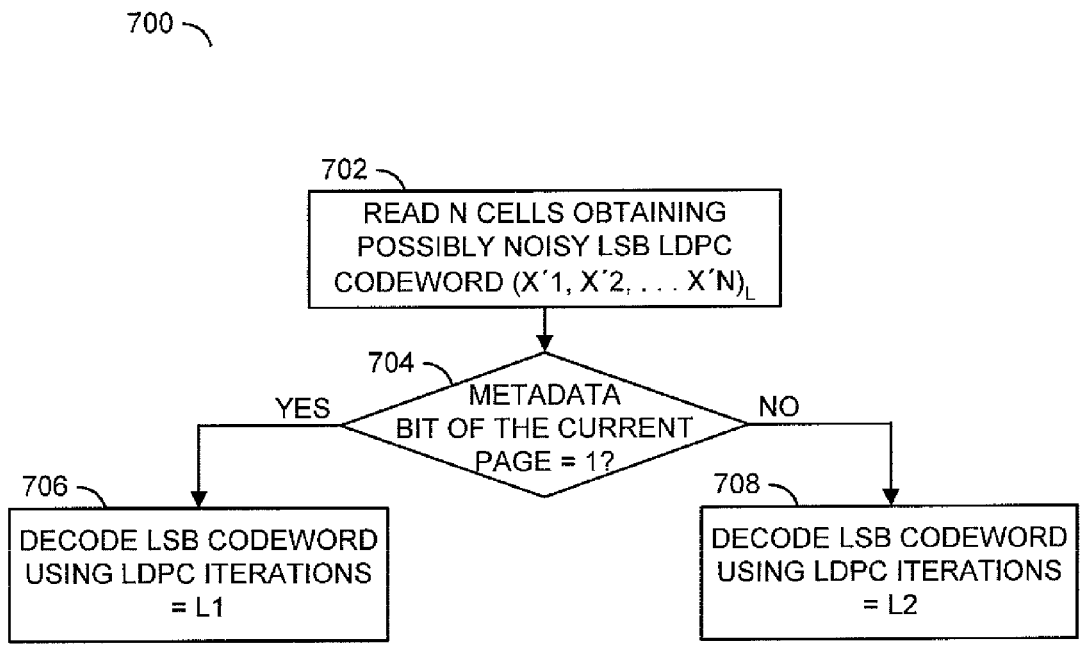
FIG. 10 is a flow diagram illustrating a process for adaptive full-strength LDPC decoding in accordance with an example embodiment of the invention.

Referring to FIG. 10, a diagram of a process 700 is shown. In various embodiments, the process (or method) 700 comprises a step (or state) 702, a step (or state) 704, a step (or state) 706, and a step (or state) 708. When full-strength decoding is performed, the process 700 begins in the step 702 where N cells are read to obtain a possibly noisy LSB LDPC codeword. In the step 704, a check is made to determine whether the metadata of the current page indicates the CRC check during the writing process was passed (e.g., a value of 1) or failed (e.g., a value of 0). If the metadata indicates that the CRC check passed, the process 700 moves to the step 706 where the original number of LDPC iterations (e.g., L1) is used. If the metadata indicates that the CRC check failed, the process 700 moves to the step 708 where a number of LDPC iterations performed by the message passing decoder is increased (e.g., to a value L2). The value L2 is generally greater than the value L1. In some instances, the values L1 and L2 may be set empirically. The metadata bits can be stored either in the memory of the flash memory controller or in the flash memory itself. The metadata bits do not need to be protected with ECCs. The decoding modes implemented in the steps 706 and 708 can also be different in other ways that make the step 708 more aggressive than the step 706 at the expense of power or decoding latency. In one instance, more bits can be used to represent an LLR in the step 708 to make the step 708 approach full precision. In another instance, an LLR scaling factor can be used that works better for codewords with a higher percentage of write errors as indicated by the metadata flag bit.

The concept of using a metadata bit for each page may be extended further. For example, when it is known that the LSB is incorrect, information (e.g., the metadata bit) can be added to the MSB page indicating that the LSB is wrong. With such information available, there are many possibilities on how decoding is performed. In some embodiments, non-binary codes (e.g., over GF($2^2$)) could be used and the upper and lower pages decoded together. In some embodiments, the metadata may be used to indicate the LSB is questionable and the MSB may be affected. In some embodiments, the metadata may be stored in the flash page itself with a number (e.g., n) of copies (e.g., to reduce chance of corruption). In general, the metadata is stored in the MSB (upper) page to avoid having to read two pages to determine how to correct one page. In some embodiments, if the LSB decoding reveals too many errors, the upper page may be written with dummy data rather than important data. In some embodiments, the dummy data written to the upper page may be written based on the difference between the lower page as written and as decoded. For example, the dummy data may be written in a way that maximizes recovery of the lower page at a later time.

The functions illustrated by the diagrams of FIGS. 5-10 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

Embodiments of the invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

Embodiments of the invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is (are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a control circuit configured to read data from and write data to a memory configured to store two or more bits per cell; and
an adaptive strength error correction code (ECC) decoder enabled to perform a plurality of different strength error correction code (ECC) decoding processes, wherein (i) after writing data to a least significant bit (LSB) page in the memory, the control circuit checks the data stored in the LSB page using a first strength error correction code (ECC) decoding process of the adaptive strength error correction code (ECC) decoder, and (ii) after writing data to a most significant bit (MSB) page associated with the LSB page in the memory, the control circuit checks the data stored in both the LSB and MSB pages using a second strength error correction code (ECC) decoding process of the adaptive strength error correction code (ECC) decoder.

2. The apparatus according to claim 1, wherein the first strength is lower than the second strength.

3. The apparatus according to claim 1, wherein writing data to the MSB page is separated in time from writing data to the LSB page.

4. The apparatus according to claim 1, wherein the adaptive error correction code decoder is configured to switch between the first strength ECC decoding process and the second strength ECC decoding process.

5. The apparatus according to claim 1, wherein the control circuit and the adaptive strength ECC decoder are part of a solid state disk (SSD) controller.

6. The apparatus according to claim 5, wherein the controller is further configured to store metadata indicating a result of reading the LSB page with the first strength ECC decoding process.

7. The apparatus according to claim 6, wherein the metadata is stored in at least one of the controller and a memory device connected to the controller.

8. The apparatus according to claim 6, wherein the controller is configured to adjust a writing process for the MSB page based upon the stored metadata indicating a result of reading the LSB page with the first strength ECC decoding process.

9. The apparatus according to claim 6, wherein the controller is configured to write data to the MSB page that can assist decoding the LSB page based upon the stored metadata.

10. The apparatus according to claim 6, wherein the controller is configured to adjust a decoding process performed on the LSB and MSB pages based upon the stored metadata.

11. A method of writing data to a memory device configured to store two or more bits per cell, the method comprising;
writing data to a least significant bit (LSB) page in the memory device;
after writing data to the LSB page, checking the data stored in the LSB page using a first strength error correction code (ECC) decoding process;
writing data to a most significant bit (MSB) page associated with the LSB page in the memory device; and
after writing data to the MSB page associated with the LSB page, checking the data stored in both the LSB and MSB pages using a second strength error correction code (ECC) decoding process.

12. The method according to claim 11, wherein the LSB and MSB pages have a common wordline.

13. The method according to claim 11, wherein the first strength is lower than the second strength.

14. The method according to claim 11, wherein the step of writing data to the MSB page is separated in time from the step of writing data to the LSB page.

15. The method according to claim 11, further comprising:
storing metadata indicating a result of reading the LSB page with the first strength ECC decoding process.

16. The method according to claim 15, further comprising:
adjusting a writing process for the MSB page based upon the stored metadata indicating a result of reading the LSB page with the first strength ECC decoding process.

17. The method according to claim 15, further comprising:
writing data to the MSB page that can assist decoding the LSB page based upon the stored metadata.

18. The method according to claim 15, further comprising:
adjusting a decoding process performed on the LSB and MSB pages based upon the stored metadata.

19. An apparatus comprising:
a memory configured to store two or more bits per cell; and
a controller configured to write data in a two-step process, wherein (i) after writing data to a least significant bit (LSB) page in the memory, the controller checks the data stored in the LSB page using a first strength error correction code (ECC) decoding process, and (ii) after writing data to a most significant bit (MSB) page associated with the LSB page in the memory, the controller checks the data stored in both the LSB and MSB pages using a second strength error correction code (ECC) decoding process.

20. The apparatus according to claim 19, wherein the memory and the controller are implemented as a solid state disk (SSD) drive.

* * * * *